United States Patent [19]

Rosenberg

[11] Patent Number: 5,034,852
[45] Date of Patent: Jul. 23, 1991

[54] GASKET FOR A HOLLOW CORE MODULE

[75] Inventor: Jack J. Rosenberg, Acton, Mass.

[73] Assignee: Raytheon Company, Lexington, Mass.

[21] Appl. No.: 432,720

[22] Filed: Nov. 6, 1989

[51] Int. Cl.$^5$ .............................................. H05K 7/20
[52] U.S. Cl. ..................................... 361/383; 277/12; 277/178; 277/228; 361/388
[58] Field of Search ..................... 165/80.3; 174/65 G, 174/152 G, 153 G; 277/126, 166, 178, 179, 189, 228, 12; 361/381–385, 388

[56] References Cited

U.S. PATENT DOCUMENTS

| | | | |
|---|---|---|---|
| 1,626,110 | 4/1927 | Bailey et al. | 277/166 |
| 2,225,472 | 12/1940 | Franklin | 174/65 G |
| 4,044,515 | 8/1977 | Hollingsead et al. | 277/178 |
| 4,277,815 | 7/1981 | Skroupa | 361/383 |
| 4,375,290 | 3/1983 | Zucchi et al. | 361/383 |
| 4,442,475 | 4/1984 | Franklin et al. | 361/383 |

OTHER PUBLICATIONS

"Design Considerations for High-Bandwidth VHSIC Systems", by Brian D. Morrison et al., Raytheon Company, 1986, Government Microcircuits Applications Conference, Las Vegas, Nevada, Nov. 1986.

Primary Examiner—Gregory D. Thompson
Attorney, Agent, or Firm—Christopher L. Maginniss; Richard M. Sharkansky

[57] ABSTRACT

A removable gasket for sealing an air-cooled hollow core module to the port of a chassis plenum for supplying cooling air includes an aluminum frame to which a thermally conductive elastomer seal is vulcanized. The gasket frame provides support for the seal and serves as a compression limiting stop for the seal. The gasket is held in alignment with the cooling channel of the hollow core module with attachment screws, greatly facilitating the gasket removal and repair of the module, and realignment with the chassis plenum port upon reassembly.

20 Claims, 2 Drawing Sheets

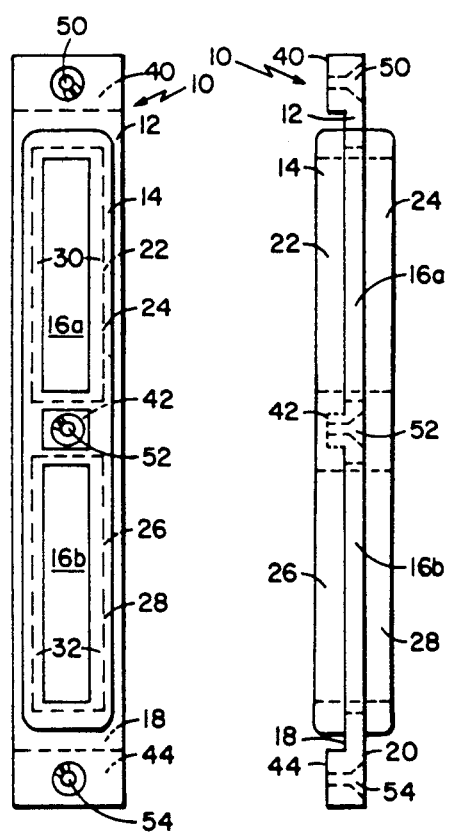
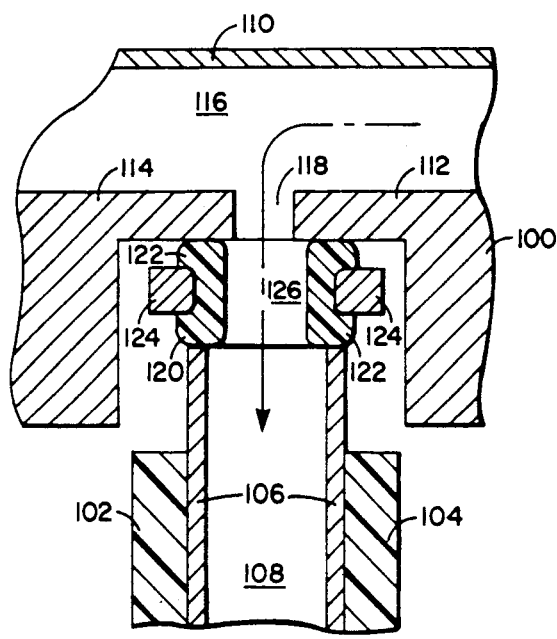
Fig. 1a      Fig. 1b      Fig. 3

GASKET FOR A HOLLOW CORE MODULE

BACKGROUND OF THE INVENTION

The present invention relates generally to electronic circuit modules and, more particularly, to a gasket for use with a hollow core, air-cooled electronic circuit module.

The recent development and ncreased utilization of very large scale integration (VLSI) and very high speed integrated circuit (VHSIC) packages have necessitated intensive investigation into methods for drawing off the heat generated by such circuits. At present, widely used methods include solid core and hollow core modules. A solid core module comprises two printed wiring boards each having surface mount components on one side and each bonded to a thermally-conductive frame material to form a sandwich assembly. Using this type of module, the heat generated into the printed wiring boards by the circuit packages is drawn off by thermal conduction.

In a hollow core module, the printed wiring circuit boards are bonded to a frame such that there is a narrow passage within the frame for the flow of cooling air. The frame may include metal fins within the passage to increase the heat transfer area. Using tnis form of module, the heat generated into the printed wiring boards by the circuit packages is drawn off by convection. Although the hollow core arrangement necessitates the more complex chassis configuration, i.e., ports and manifolds for the controlled flow of cooling air through the chassis and modules, it provides a significant improvement in cooling capacity over its solid core counterpart. As an example, for a solid core module having a thermal capacity in the order of 20 to 40 watts, an equivalently-sized hollow core module will be able to dissipate heat in the order of 70 to 100 watts.

The present invention is directed for use with a hollow core module. It is recognized that providing a proper seal between the hollow core within the frame and the corresponding air port in the chassis maximizes the cooling effect of the air flow therethrough by preventing the leakage of the air from its intended path. However, the required positioning of such a seal, relative to the direction of motion of the module during its insertion into and extraction from the chassis, poses a high risk of damage to the seal.

In the prior art, the seals have comprised flat gaskets cemented to the sidewalls of the chassis. This arrangement has made repair of a damaged seal very difficult. Such a repair necessitates taking apart the chassis, and special tooling is required to provide a controlled glue line and for centering the gasket around the air slot. Such extensive repair can rarely be effected at the field level; thus, damage to a gasket often disables an entire electronics system while the chassis is returned to depot for repair.

SUMMARY OF THE INVENTION

It is therefore a primary object of the present invention to provide an improved gasket for use with a hollow core, air-cooled electronic circuit module.

It is a further object of the present invention to provide such a gasket which is readily replaceable at the field level.

It is, a still further object of the present invention to provide such a gasket which is electrically conductive between the electronic circuit module and the chassis interface.

In accordance with the principles of the present invention, a gasket is disclosed for constraining air flow through the core of a hollow core electronics module. The gasket comprises a frame having two opposite surfaces, the frame having an aperture therethrough between the two surfaces. The frame is adapted for mounting one of the surfaces against the electronics module such that the aperture is in communication with the hollow core. The gasket also includes a seal extending through said aperture and affixed to said two surfaces.

Further in accordance with the present invention, an electronics module includes support means having first and second side walls in substantially parallel relationship, the side walls being spaced apart by a gap, and first and second circuit boards affixed respectively to the first and second side walls. The module further includes a gasket for constraining air flow through the gap, the gasket comprising a frame having two opposite surfaces, the frame having an aperture therethrough between the two surfaces, the frame being adapted for mounting one of the surfaces against the support means such that the aperture is in communication with the gap, and a seal extending through the aperture and affixed to the two surfaces. Finally, the electronics module includes means for fastening the gasket to the support means.

With such arrangement, a gasket may be attached to a hollow core module via fastening means, typically screws, aligning the cooling channels of the module with a port of the chassis cooling air plenum, thereby greatly facilitating the removal and replacement of the gasket at the field level.

BRIEF DESCRIPTION OF THE DRAWINGS

Other features and advantages of the present invention will be more fully understood from the following detailed description of the preferred embodiment, the appended claims, and the accompanying drawings, in which:

FIG. 1a is a front view of the gasket according to the present invention;

FIG. 1b is a side view of the embodiment of FIG. 1a;

FIG. 2 illustrates a portion of a hollow core module including the gasket of FIG. 1a; and FIG. 3 illustrates the arrangement of a hollow core module including the gasket of FIG. 1a within a cutaway section of an air-cooled chassis.

DESCRIPTION OF THE PREFERRED EMBODIMENT

Figure 2:
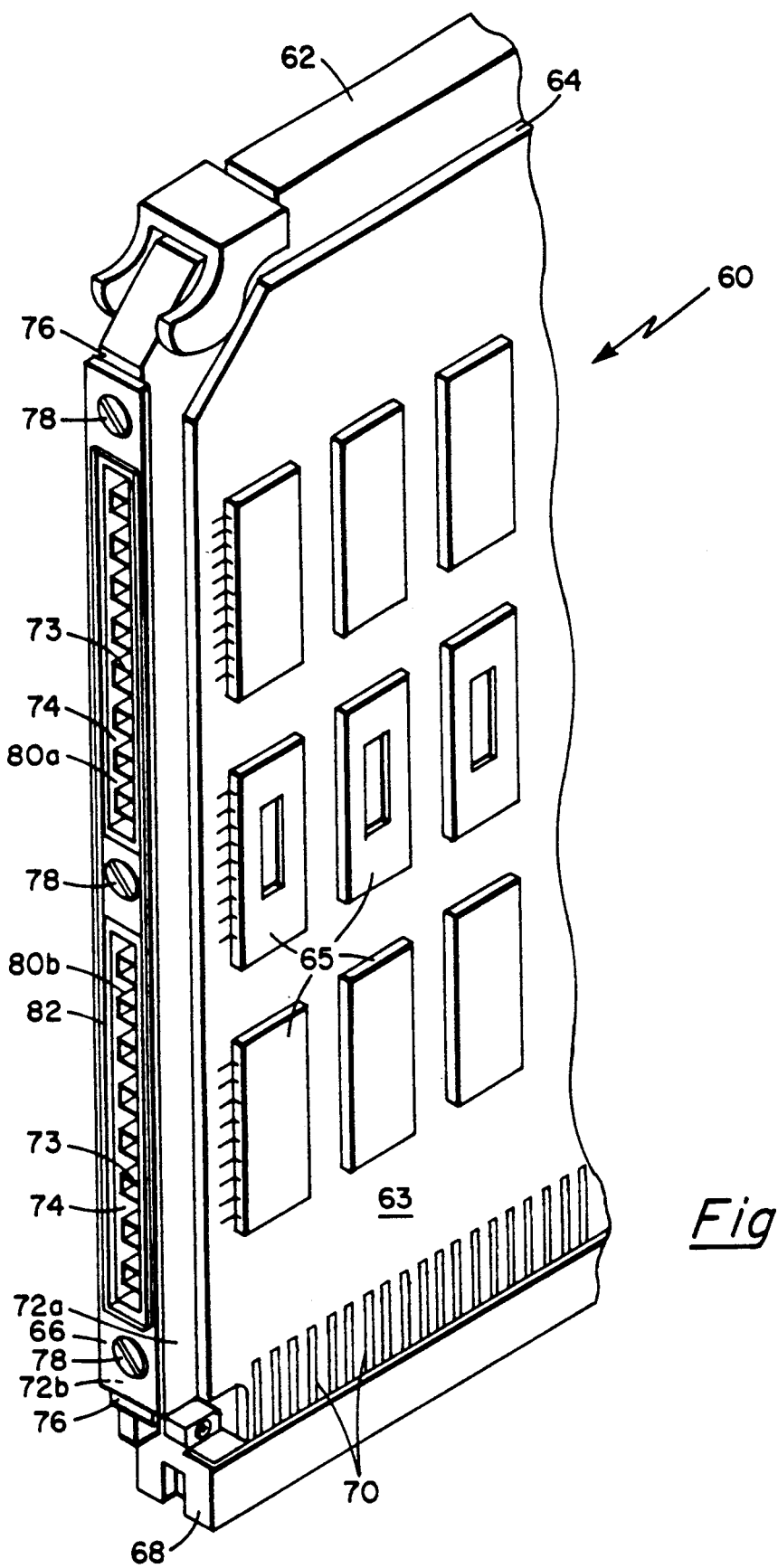

Referring to FIGS. 1a and 1b, there are shown front and side views, respectively, of a gasket 10 according to the principles of the present invention. In these figures, as well as in the remaining figures, the same numerical designators refer to the same, or substantially the same, elements. It should also be noted that the figures are representative depiction, and that the relative dimensions may be exaggerated.

Gasket 10 comprises two elements, frame 12 and seal 14. Frame 12 is typically a metallic member, illustratively fabricated of aluminum. Frame 12 has a generally flat the apertures through which cooling air passes between the hollow core module and the chassis interface. Although two apertures 16a and 16b are illustrated, it will be recognized that a single aperture, or more than two, may be included. The illustrated embodiment has been found to permit adequate air flow while providing sufficient attachment means for gasket 10 to the hollow core module. Frame 12 further includes apertures 50, 52 and 54 for attachment, illustratively, by flat-head screws to a substantially flat surface on the hollow core module. Apertures 50, 52 and 54 may include tapered recesses to accommodate flush mounting of flat-head screws.

Seal 14 is typically fabricated of an elastomer, illustratively a silicone elastomer impregnated with silver-plated aluminum particles, such as Cho-Seal 1285, sold by Chromerics, Inc., of Woburn, Mass. Seal 14 is formed on frame through apertures 16a and 16b, forming raised portions 22, 24, 26 and 28 above surfaces 18 and 20. The top surfaces of raised portions 22, 24, 26 and 28 comprise the gasket mating surfaces. Raised portion 22 forms a ring which surrounds aperture 16a above surface 18; raised portion 24 forms a ring which surrounds aperture 16a above surface 20. Raised portion 26 forms a ring which surrounds aperture 16b above surface 18; raised portion 28 forms a ring which surrounds aperture 16b above surface 20. Raised portions 22 and 24 are joined by a portion 30 of seal 14 which extends continuously through aperture 16a. Similarly, raised portions 26 and 28 are joined by a portion 32 of seal 14 which extends continuously through aperture 16b.

Frame 12 additionally includes three flat surfaces 40, 42 and 44, which are elevated a small distance above surface 18. Surfaces 40, 42 and 44 correspond, respectively, to the positions of apertures 50, 52 and 54, on frame 12. The heights of these surfaces 40, 42 and 44 above surface 18 are all substantially equal and are less than the heights of raised portions 22 and 26 above surface 18. Thus, when gasket 10 is fastened, illustratively, using flat-head screws (not shown), through apertures 50, 52 and 54, to a substantially flat surface on a hollow core module (not shown) such that surface 18 of gasket 10 is in correspondence with the module surface, raised portions 22 and 26 will be drawn into compression as surfaces 40, 42 and 44 contact the module surface, thereby ensuring a sealing effect around apertures 16a and 16b. Th relative heights of surfaces 40, 42 and 44, and of raised portions 22 and 26 above surface 18 of frame 12 are selected to provide the desired degree of sealing in view of the material of raised portions 22 and 26 and the pressure of the fluid flow through apertures 16a and 16b. By way of illustration, flat surfaces 40, 42 and 44 may be elevated 0.030 inch (0.76 mm) above surface 18 and raised postions 22 and 16 may be elevated 0.036 inch (0.91 mm) above surface 18, for a sealing material of the type described herein.

The foregoing description includes an illustrative example wherein the sealing material is fabricated of a silicone elastomer impregnated with silver-plated aluminum particles and wherein the sealing material is vulcanized to the aluminum gasket frame. Alternatively, the sealing material may be bonded to the aluminum gasket frame by an electrically conductive RTV, which may be of a type similar to Cho-Bond 1030, sold by Chromerics, Inc. With either arrangement, an electrically conductive path may be established between the hollow core frame and the chassis to maintain proper grounding throughout the system.

Referring now to FIG. 2, there is shown a portion of a hollow core module 60 generally comprising a frame 62, a connector 68 for supporting a multiplicity of pins (not shown), two printed wiring circuit board assemblies (only one assembly 63 is shown), and a gasket 66 which may be of the type disclosed as gasket 10 in the description corresponding to FIGS. 1a and 1b. Printed wiring circuit board assembly 63 includes, in the present example, a printed wiring circuit board 64, a plurality of integrated circuits 65, and printed wiring traces 70 for coupling between integrated circuits 65 and the pins of connector 68.

Module frame 62 comprises a support structure including plates 72a and 72b, against which circuit boards 64 are bonded. Plates 72a and 72b are generally positioned parallel to each other, with a relatively narrow gap 74 between them. Within gap 74 there may be a metallic corrugated structure 73, bonded between plates 72a and 72b, to enhance the transfer of heat energy from plates 72a and 72b into gap 74.

Gasket 66 is attached to a front edge surface 76 of module frame 62, illustratively, by flat-head screws 78. As such, it is readily removable for quick and easy replacement in the event of damage. Seal 82 of gasket 66 is drawn into compression against surface 76 by attachment screws 78. Apertures 80a and 80b in gasket 66 are positioned in alignment with gap 74.

Referring to FIG. 3, there is shown a sectional view of a portion of a chassis 100 which pro ides cooling air for hollow core modules. The view of FIG. 3 includes a pair of printed wiring circuit boards 102 and 104 bonded to a frame module 106, which may be of the type show as module frame 62 in FIG. 2. The section view of FIG. 3 depicts an air passage gap 108 through module frame 106. The portion of chassis 100 illustrated in the figure includes an outer wall 110 and module support members 112 and 114 which form a plenum 116 for the passage of cooling air. Support members 112 and 114 are arranged to provide an inlet port 118 for the cooling air to flow through gap 108 within module frame 106.

The flow of air from cooling air supply plenum 116 to gap 108 is sealed by gasket 120 attached to module frame 106. Gasket 120 may be of a type shown as gasket 10 in FIGS. 1a and 1b. As shown in FIG. 3, gasket 120 comprises seal 122 bonded to gasket frame 124. Aperture 126 through gasket frame 124 is positioned in correspondence with port 118 and gap 108 for the flow of cooling air therethrough. Seal 122 is held in mild compression against module frame 106 by the attachment of gasket frame 124 to module frame 106 (as described in an earlier paragraph); seal 122 is also held firmly against module support members 112 and 114 by virtue of the positioning of module frame 106 within chassis 100, thereby minimizing the leakage of air in the interface between chassis 100 and module frame 106.

Although not explicitly shown, it will be readily understood that module frame 106 may have a gasket, substantially similar to gasket 120, positioned at the opposite end of gap 108, to seal the interface between module frame 106 and module support members (not shown), which may be similar to support members 112 and 114, thereby enabling the flow of cooling air into a chassis exhaust plenum (not shown).

It is thus seen that a gasket according to the present invention provides a ready and inexpensive means of repairing a system assembly which is subject to damage during use. Such repair is effected at the field level by the simple replacement of a component which may be maintained within spare parts.

While the principles of the present invention have been demonstrated with particular regard to the illustrated structure of the figures, it will be recognized that various departures may be undertaken in the practice of the invention. The scope of this invention is not intended to be limited to the particular structure disclosed herein, but should instead be gauged by the breadth of the claims which follow.

What is claimed is:

1. A gasket assembly for constraining air flow through the core of a hollow core electronics module, said gasket assembly comprising:
   a frame having two opposite surfaces, said frame having first and second apertures therethrough between said two surfaces, said frame adapted for mounting one of said surfaces against the electronics module such that said apertures are in communication with the core; and
   a seal having first and second openings, said seal extending through said first and second apertures and affixed to said two surfaces.

2. The gasket assembly according to claim 1 wherein said frame comprises aluminum.

3. The gasket assembly according to claim 1 wherein said seal comprises an elastomer.

4. The gasket assembly according to claim 1 wherein said seal is electrically conductive.

5. The gasket assembly according to claim 4 wherein said electrically-conductive seal comprises an elastomer having silver-plated aluminum particles.

6. The gasket assembly according to claim 1 wherein said seal is affixed to said frame by vulcanization.

7. The gasket assembly according to claim 1 wherein said one surface of said frame adapted for mounting against the module includes a raised surface elevated above said one surface, said seal affixed to said one surface being more elevated above said one surface than said raised surface.

8. An electronics module comprising:
   support means having first and second side walls in substantially parallel relationship, said side walls being spaced apart by a gap;
   first and second circuit boards affixed respectively to said first and second side walls;
   a gasket assembly for constraining air flow through said gap, said gasket assembly comprising a frame having two opposite surfaces, said frame having an aperture therethrough between said two surfaces, said frame having one of said surfaces mounted against said support means such that said aperture is in communication with said gap, and a seal having an opening, said seal extending through said aperture and affixed to said two surfaces; and
   means for fastening said gasket assembly to said support means.

9. The module according to claim 8 wherein said frame comprises aluminum.

10. The module according to claim 8 wherein said frame further includes a second aperture, said seal further extending through said second aperture.

11. The module according to claim 8 wherein said seal comprises an electrically conductive elastomer.

12. The module according to claim 8 wherein said seal is affixed to said frame by vulcanization.

13. The module according to claim 8 wherien said fastening means provides ready detachment of said gasket assembly from said frame.

14. The module according to claim 13 wherein said fastening means comprises a plurality of screws.

15. The module according to claim 8 wherein said one surface of said frame mounted against said support means includes a raised surface elevated above said one surface, said seal affixed to said one surface being more elevated above said one surface than said raised surface, such that said seal affixed to said one surface is compressed against said support means when said gasket assembly is fastened to said support means.

16. The module according to claim 15 wherein said fastening means is positioned at said raised surface of said frame.

17. The module according to claim 8 further including means in said gap for transferring heat from said side walls into said gap.

18. A gasket assembly for constraining air flow through the core of a hollow core electronics module, said gasket assembly comprising:
   a frame having two opposite surfaces, said frame having an aperture therethrough between said two surfaces, said frame adapted for mounting one of said surfaces against the electronics module such that said aperture is in communication with the core; and
   a seal having an opening, said seal extending through said aperture and affixed to said two surfaces,
   wherein said one surface of said frame adapted for mounting against the module includes a raised surface elevated above said one surface, said seal affixed to said one surface being more elevated above said one surface than said raised surface.

19. The gasket assembly according to claim 18 wherein said frame further includes a second aperture, said seal further extending through said second aperture.

20. The gasket assembly to claim 18 wherein said seal comprises an elastomer.

* * * * *